(12) United States Patent
Shih et al.

(10) Patent No.: US 8,389,358 B2
(45) Date of Patent: Mar. 5, 2013

(54) MANUFACTURING METHOD AND STRUCTURE OF NON-VOLATILE MEMORY

(75) Inventors: Hung-Lin Shih, Hsinchu (TW); Chih-Ta Chen, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 109 days.

(21) Appl. No.: 13/188,595

(22) Filed: Jul. 22, 2011

(65) Prior Publication Data
US 2013/0020625 A1 Jan. 24, 2013

(51) Int. Cl.
*H01L 21/336* (2006.01)
(52) U.S. Cl. ........ 438/257; 438/597; 438/634; 257/734; 257/758; 257/760; 257/E21.409
(58) Field of Classification Search .................. 438/257, 438/597, 634; 257/734, 758, 760, E21.409
See application file for complete search history.

(56) References Cited

U.S. PATENT DOCUMENTS

| | | | | |
|---|---|---|---|---|
| 6,091,121 A * | 7/2000 | Oda | ............................. | 257/408 |
| 6,184,119 B1 * | 2/2001 | Ku et al. | ........................ | 438/597 |
| 6,635,576 B1 * | 10/2003 | Liu et al. | ........................ | 438/700 |
| 7,714,392 B2 * | 5/2010 | Chang et al. | ................... | 257/369 |
| 2002/0111002 A1 * | 8/2002 | Kim | ................................ | 438/592 |
| 2007/0023822 A1 | 2/2007 | Sung et al. | | |
| 2007/0109860 A1 | 5/2007 | Lin et al. | | |
| 2008/0111182 A1 | 5/2008 | Irani et al. | | |

\* cited by examiner

*Primary Examiner* — Angel Roman
(74) *Attorney, Agent, or Firm* — WPAT PC; Justin King

(57) ABSTRACT

A non-volatile memory structure includes a substrate; a poly gate structure formed on the substrate; a contact etching stop layer formed over the poly gate structure and including at least a silicon nitride layer and a first silicon oxide layer overlying the silicon nitride layer; and an inter-layer dielectric layer formed on the first silicon oxide layer. The first silicon oxide layer has a density higher than that of the inter-layer dielectric layer.

12 Claims, 2 Drawing Sheets

MANUFACTURING METHOD AND STRUCTURE OF NON-VOLATILE MEMORY

FIELD OF THE INVENTION

The present invention relates to a method for manufacturing a memory, and more particularly to a method for manufacturing a non-volatile memory. The present invention also relates to a memory structure, and more particularly to a non-volatile memory structure.

BACKGROUND OF THE INVENTION

A non-volatile memory is capable of retaining data stored therein even when the power is off. Particularly, a Multiple-Times-Programmable (MTP) non-volatile memory is popular for use in modern digital products.

A MTP non-volatile memory is basically implemented with a floating gate and a control gate, wherein the written-in data is stored in the floating gate in a form of charges. A variety of manufacturing processes have been used for forming a MTP non-volatile memory, which result in different memory structures accordingly. For example, so-called triple-layer poly process, dual-layer poly process and single-layer poly process are commonly used. Please be noted that the term "poly" used herein and hereinafter is commonly used in this field for indicating the material "polysilicon". The single-layer poly process involves less procedures compared to other processes, but the retention capability of the resulting single poly structure for retaining the charges in the floating gate is unsatisfactory. For example, when the resulting structure is subjected to baking at 250° C., charges in the floating gate are largely lost and the current intensity between the source/drain electrodes is largely decreased to a level which might result in data error.

SUMMARY OF THE INVENTION

Therefore, an object of the present invention is to provide a simple process for manufacturing a non-volatile memory with improved data retention capability.

The present invention relates to a method for manufacturing a non-volatile memory. The method includes: providing a substrate formed thereon a poly gate structure; forming a contact etching stop layer over the poly gate structure, which includes at least a silicon nitride layer and a first silicon oxide layer, wherein the silicon nitride layer is disposed under the first silicon oxide layer; and forming an inter-layer dielectric layer over the contact etching stop layer. The first silicon oxide layer is disposed adjacent to the inter-layer dielectric layer and has a density higher than that of the inter-layer dielectric layer.

The present invention further relates to a non-volatile memory structure, which includes a substrate; a poly gate structure formed on the substrate; a contact etching stop layer formed over the poly gate structure and including at least a silicon nitride layer and a first silicon oxide layer, wherein the silicon nitride layer is disposed under the first silicon oxide layer; and an inter-layer dielectric layer formed on the first silicon oxide layer. The first silicon oxide layer has a density higher than that of the inter-layer dielectric layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
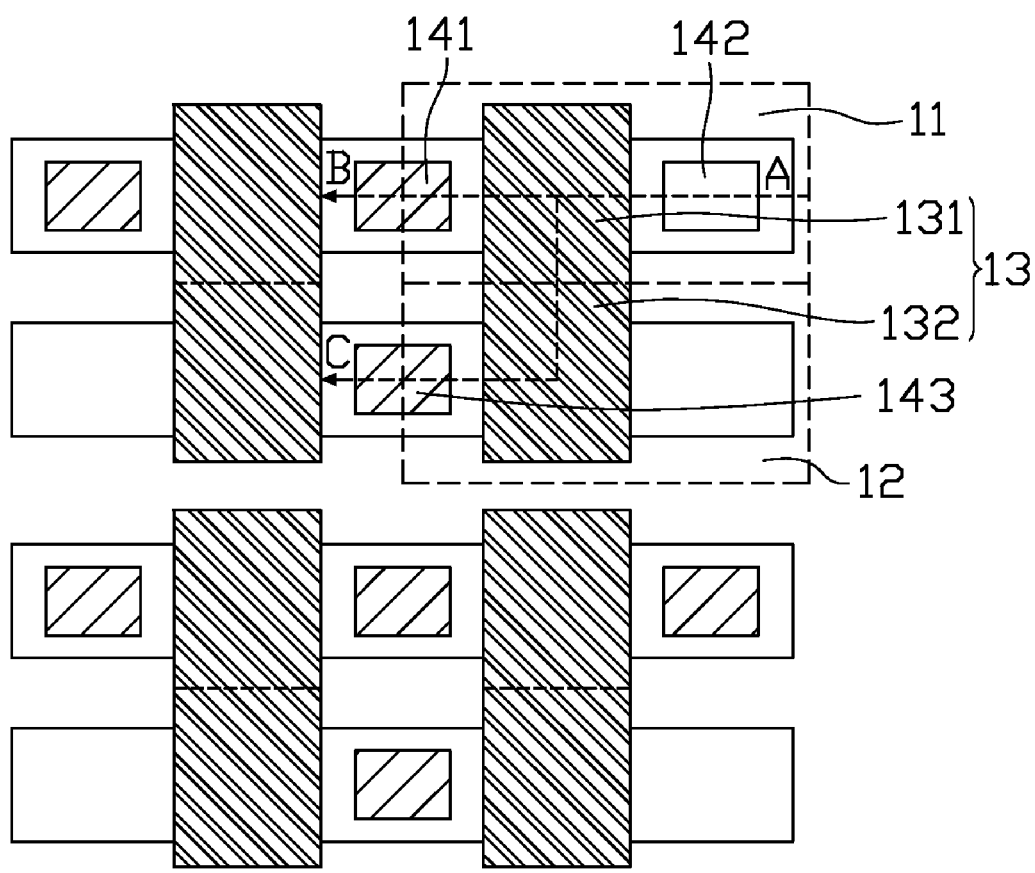
FIG. 1A is a top view schematically illustrating a non-volatile memory having a single poly structure according to an embodiment of the present invention.

Please refer to FIG. 1A, which schematically illustrates a top view of a non-volatile memory having a single poly structure according to an embodiment of the present invention. As shown, the memory structure includes a floating gate area 11, a control gate area 12, and a polysilicon conductor 13 extending through both the floating gate area 11 and the control gate area 12. A first portion 131 of the polysilicon conductor 13 is disposed in the floating gate area 11 between a source contact electrode 141 and a drain contact electrode 142. A second portion 132 of the polysilicon conductor 13 is disposed in the control gate area 12 and a control electrode 143 is formed at one side of the polysilicon conductor portion 132.

Figure 1B:
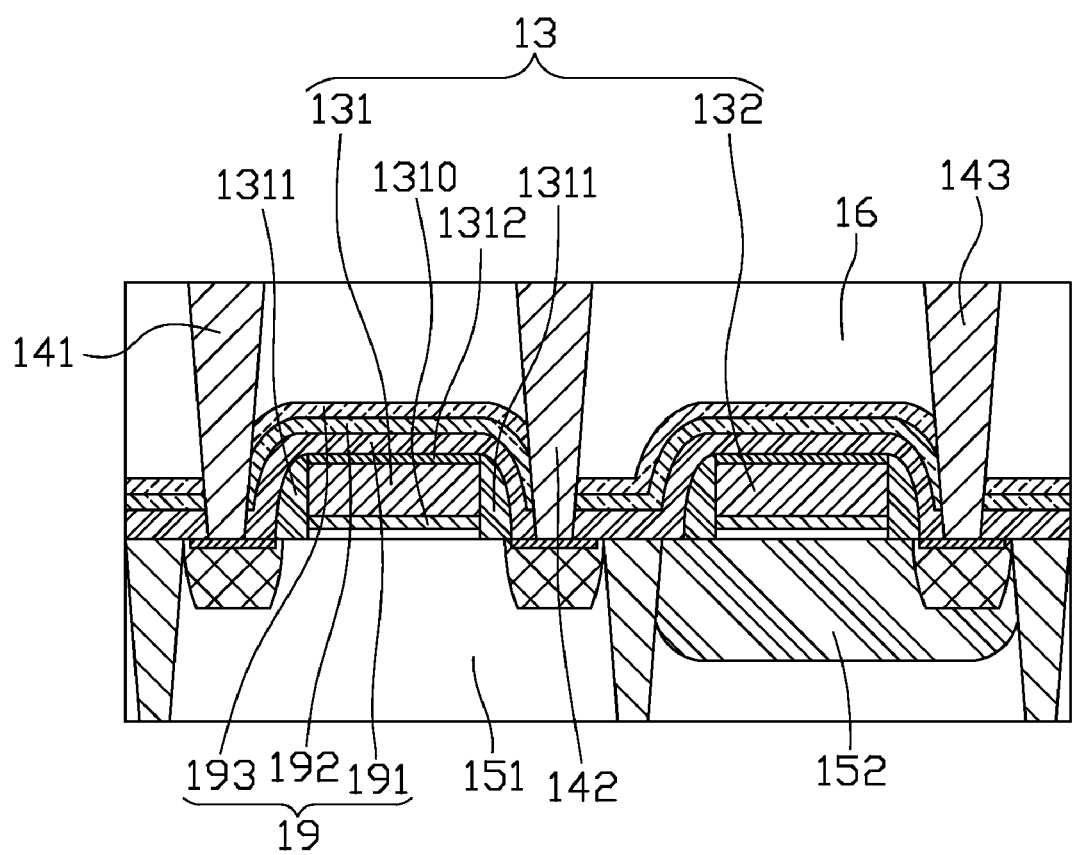
FIG. 1B is a combined cross-sectional view taken along the dash lines A-B and A-C shown in FIG. 1A, schematically illustrating one of the memory units included in the non-volatile memory.

Please refer to FIG. 1B, which is a combined cross-sectional view taken along the dash lines A-B and A-C shown in FIG. 1A, schematically illustrating one of the memory units included in the non-volatile memory. It can be seen from FIG. 1B that the polysilicon conductor 13 is a continuous structure extending across the floating gate area 11 and the control gate area 12. A P-well region 151 is formed under the conductor portions 131 and 132, and an N-well region 152 is additionally formed just below the conductor portion 132, serving as a control gate for controlling the injection of electron/hole carriers into the polysilicon conductor 13 due to the hot carrier effect. In this way, the threshold voltage of the floating gate implemented with the conductor portion 131 can be changed so as to conduct or shut off the memory unit. Furthermore, according to the current intensity measured through the source contact electrode 141 and drain contact electrode 142, whether data "1" or "0" is stored in the memory unit can be determined.

For improving the charge retention capability of the floating gate in the single poly structure, a variety of dielectric thin films or structures are provided surrounding the polysilicon conductor 13. For example, a dielectric layer 1310 is formed under the polysilicon conductor 13; sidewalls 1311 are formed around the polysilicon conductor 13; and metal silicide 1312, contact etching stop layer (CESL) 19 and inter-layer dielectric (ILD) layer 16 sequentially overlie the polysilicon conductor 13. These layers, in addition to the use in subsequent contact hole process, facilitate in preventing from loss of charges from the floating gate 131.

In a preferred embodiment, the contact etching stop layer 19 is multi-layered, and formed on the continuous polysilicon conductor 13 as a conformal film. In an example as shown in FIG. 1B, the contact etching stop layer 19 includes a silicon oxide layer 191, a silicon nitride layer 192, and another silicon oxide layer 193. The silicon oxide layer 191 is formed of tetraethyl orthosilicate ($Si(OC_2H_5)_4$ or TEOS in short) by depositing and has thickness of about 100~500 angstroms. The silicon oxide layer 193 is formed of TEOS by plasma enhanced chemical vapor deposition (CVD) and has thickness of about 300~2000 angstroms. Preferably, the silicon oxide layer 193 is formed as a compressive strain layer and has a density higher than that of the ILD layer 16, which is formed by atmospheric pressure CVD. The differential physical property of the silicon oxide layer 193 from the ILD layer 16 improves data retention capability of the resulting memory unit. Concretely, after the resulting structure is subjected to baking at 250° C. for 48 hours, only little change from 33.3 microamps to 33 microamps occurs in current intensity between the source contact electrode 141 and the drain contact electrode 142. The charge retention capability is significantly improved.

Although a triple-layer CESL 19 is exemplified in the above-described embodiment for practicing the present invention, the CESL 19 does not have to be triple-layered. In other words, it may include two layers or more than three layers.

For example, the CESL 19 may be a dual-layered structure consisting of the silicon nitride layer 192 and the silicon oxide layer 193 only, i.e. omitting the other silicon oxide layer 191. Likewise, the silicon oxide layer 193 is formed of TEOS by plasma enhanced chemical vapor deposition (CVD) and has thickness of about 300~2000 angstroms. The differential physical property of the silicon oxide layer 193 from the ILD layer 16 improves data retention capability of the resulting memory unit. Concretely, after the resulting structure is subjected to baking at 250° C. for 48 hours, current intensity between the source contact electrode 141 and the drain contact electrode 142 changes from 29.3 microamps to just 24.2 microamps. The charge retention capability is still satisfactory.

In contrast, if the dual-layered CESL 19 consists of only the silicon oxide layer 191 and the silicon nitride layer 192 instead, the experimental data show that after the resulting structure is subjected to baking at 250° C. for 48 hours, current intensity between the source contact electrode 141 and the drain contact electrode 142 largely changes from 28.16 microamps to 0.88 microamps.

On the other hand, if a single-layered CESL consists of only the silicon nitride layer 192, current intensity between the source contact electrode 141 and the drain contact electrode 142 largely changes from 27.6 microamps to 0.4 microamps after the resulting structure is subjected to baking at 250° C. for 48 hours.

With the options in layers of the CESL 19, the subsequent contact-hole etching process may vary. For example, more than one etching steps may be required with different etching formulae.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a non-volatile memory, comprising:
   providing a substrate formed thereon a poly gate structure;
   forming a contact etching stop layer over the poly gate structure, which includes at least a silicon nitride layer and a first silicon oxide layer overlying the silicon nitride layer; and
   forming an inter-layer dielectric layer over the contact etching stop layer;
   wherein the first silicon oxide layer is disposed adjacent to the inter-layer dielectric layer and has a density higher than that of the inter-layer dielectric layer.

2. The method according to claim 1, wherein the poly gate structure includes at least one polysilicon conductor.

3. The method according to claim 2, wherein the poly gate structure is formed by:
   forming a dielectric layer on the substrate;
   forming the polysilicon conductor on the dielectric layer;
   forming a sidewall structure around the polysilicon conductor; and
   forming a metal silicide on the polysilicon conductor.

4. The method according to claim 1, wherein the contact etching stop layer is formed by:
   forming a second silicon oxide layer over the poly gate structure;
   forming the silicon nitride layer on the second silicon oxide layer; and
   forming the first silicon oxide layer on the silicon nitride layer.

5. The method according to claim 1, wherein the first silicon oxide layer is formed of tetraethyl orthosilicate by plasma enhanced chemical vapor deposition to a thickness ranged between 300 and 2000 angstroms.

6. The method according to claim 1, wherein the inter-layer dielectric layer is formed by atmospheric pressure chemical vapor deposition.

7. A non-volatile memory structure, comprising:
   a substrate;
   a poly gate structure formed on the substrate;
   a contact etching stop layer formed over the poly gate structure and including at least a silicon nitride layer and a first silicon oxide layer overlying the silicon nitride layer; and
   an inter-layer dielectric layer formed on the first silicon oxide layer;
   wherein the first silicon oxide layer has a density higher than that of the inter-layer dielectric layer.

8. The non-volatile memory structure according to claim 7, wherein the poly gate structure includes at least one polysilicon conductor configured to form a floating gate of the non-volatile memory.

9. The non-volatile memory structure according to claim 8, wherein the poly gate structure further includes:
   a dielectric layer disposed between the substrate and the polysilicon conductor;
   a sidewall structure disposed around the polysilicon conductor; and
   a metal silicide layer disposed on the polysilicon conductor.

10. The non-volatile memory structure according to claim 7, wherein the contact etching stop layer further includes a second silicon oxide layer disposed between the poly gate structure and the silicon nitride layer.

11. The non-volatile memory structure according to claim 7, wherein the first silicon oxide layer is a compressive strain layer having a thickness ranged between 300 and 2000 angstroms.

12. The non-volatile memory structure according to claim 7, wherein the inter-layer dielectric layer is formed of silicon oxide.

* * * * *